(12) United States Patent
Iwata et al.

(10) Patent No.: US 7,964,958 B2
(45) Date of Patent: Jun. 21, 2011

(54) HEATSINK STRUCTURE FOR SOLID-STATE IMAGE SENSOR

(75) Inventors: Yukihiro Iwata, Osaka (JP); Shinya Ogasawara, Hyogo (JP); Miyoko Irikiin, Hyogo (JP)

(73) Assignee: Panasonic Corporation, Osaka (JP)

( * ) Notice: Subject to any disclaimer, the term of this patent is extended or adjusted under 35 U.S.C. 154(b) by 81 days.

(21) Appl. No.: 12/034,234

(22) Filed: Feb. 20, 2008

(65) Prior Publication Data

US 2008/0198556 A1 Aug. 21, 2008

(30) Foreign Application Priority Data

Feb. 20, 2007 (JP) ................................. 2007-039131

(51) Int. Cl.
*H01L 23/34* (2006.01)
(52) U.S. Cl. ......... 257/712; 257/E31.131; 257/E23.103; 361/717
(58) Field of Classification Search .................. 257/712, 257/E31.131, E23.101–E23.103, 713–722; 438/66, 67, 122, 902, 432–437; 361/704, 361/717, 718
See application file for complete search history.

(56) References Cited

U.S. PATENT DOCUMENTS

| | | | |
|---|---|---|---|
| 4,156,458 A * | 5/1979 | Chu et al. .......................... | 165/81 |
| 5,381,859 A | 1/1995 | Minakami et al. | |
| 6,273,186 B1 | 8/2001 | Ognibene et al. | |
| 6,301,110 B1 | 10/2001 | Kodaira | |
| 6,452,800 B2 | 9/2002 | Lee et al. | |
| 6,590,770 B1 | 7/2003 | Rogers et al. | |

FOREIGN PATENT DOCUMENTS

| | | |
|---|---|---|
| JP | 55-27679 | 2/1980 |
| JP | 1-295575 | 11/1989 |
| JP | 4-199736 | 7/1992 |
| JP | 5-3272 | 1/1993 |
| JP | 6-74675 | 3/1994 |
| JP | 2001-308569 | 11/2001 |
| JP | 2002-184922 | 6/2002 |
| JP | 2002-247594 | 8/2002 |

OTHER PUBLICATIONS

Machine translation of JP2001-308569.*

* cited by examiner

*Primary Examiner* — Matthew C Landau
*Assistant Examiner* — Jessica Hall
(74) *Attorney, Agent, or Firm* — Wenderoth, Lind & Ponack, L.L.P.

(57) ABSTRACT

A heatsink structure for solid-state image sensors includes a foil-like heatsink sheet made of a high heat conductivity material. The heatsink sheet has a first fixed portion fixed to a solid-state image sensor and a second fixed portion fixed to another member. The heatsink sheet also has a plurality of cutout portions formed along directions from the first fixed portion toward the second fixed portion. Thus, the heatsink structure can cool the solid-state image sensor while reducing any external-force loads applied to the solid-state image sensor with a relatively simple structure.

7 Claims, 6 Drawing Sheets

HEATSINK STRUCTURE FOR SOLID-STATE IMAGE SENSOR

BACKGROUND OF THE INVENTION

1. Field of the Invention

The present invention relates to a heatsink structure for solid-state image sensors to be used for image pickup devices such as television cameras and video cameras including solid-state image sensors.

2. Description of Related Art

In recent years, there have been developed, and now in widespread use, 3CCD color cameras (hereinafter, referred to as 3CCD cameras) as an image pickup device using three solid-state image sensors. The structure of such a conventional 3CCD camera is explained below with reference to the accompanying drawings.

FIG. 1 is a schematic sectional view of an image pickup block 10 in a conventional 3CCD camera. As shown in FIG. 1, the image pickup block 10 includes a color separation prism for separating incident light, which has come up through an image pickup lens (not shown) of the 3CCD camera, into specified color components, a plurality of solid-state image sensors, and image sensor boards on which the solid-state image sensors are mounted, respectively.

As shown in FIG. 1, the color separation prism is made up of three prism members 1r, 1g, 1b, which are joined together in close contact with one another. The color separation prism constructed like this is a three color separation prism 1 for separating incident light into three color components. Junction interfaces among the prism members r, 1g, 1b serve as dichroic mirrors 4, 5. On light-outgoing surfaces of the three prism members 1r, 1g, 1b, solid-state image sensors 2r, 2g, 2b are fixed individually with adhesive.

Referring to FIG. 1, a light beam 7 incident on the three color separation prism 1 is separated by the dichroic mirrors 4, 5 into light beams 6a, 6b, 6c of three color components, i.e. three primary colors of light, and the resultant light beams are received by their corresponding solid-state image sensors 2r, 2g, 2b, respectively. Out of the light beams separated into the three primary colors and reflected by the dichroic mirrors 4, 5, the light beams 6a, 6b are totally reflected again within the prism members 1g, 1b, respectively, thereby being received by the solid-state image sensors 2g, 2b as light beams that form not a mirror image (reflected image) but a non-mirror image. Image pickup signal processing for the individual light beams received by the solid-state image sensors 2g, 2b, 2r, respectively, is performed by the image sensor boards 3r, 3g, 3b, respectively, so that a color television signal into which the image pickup signals have been synthesized is obtained.

For the conventional 3CCD camera having such a structure described above, there is a need for achieving high-accuracy superimposition of three-color subject images. Poor accuracy of superimposition, i.e. poor accuracy of registration, would lead to occurrence of color differences or moire false signals, resulting in a subtly deteriorated image. Accordingly, in order to prevent any deterioration of registration accuracy, there is a need for reducing external-force loads applied to the respective solid-state image sensors 2r, 2g, 2b.

Further, a solid-state image sensor, if used under a high-temperature environment, would undergo image quality deterioration due to white scratches, life reduction and so on, and therefore needs to be used at a specified temperature or lower. Particularly in recent years, in image pickup devices typified by 3CCD cameras on which solid-state image sensors are mounted, there is a tendency that the ambient temperature of the solid-state image sensors (i.e., internal temperature within the device casing) increases more and more with increasing power consumption that can be attributed to light, thin, short and small dimensions and more multiple and higher functions of the device, making it indispensable to provide a means for cooling the solid-state image sensors.

Therefore, in conventional image pickup devices, there have been proposed various heat radiating structures or heatsink structures for efficiently cooling solid-state image sensors while reducing the external loads applied to the solid-state image sensors (see, e.g., Japanese patent application publication No. H1-295575, Japanese patent application publication No. 2002-247594, and Japanese patent application publication No. 2001-308569).

First, JP H1-295575 proposes a heat radiating structure in which a thermoelectric cooling device mounted on a heat transfer member by screws is placed so as to be in contact with the back face of each solid-state image sensor. JP H1-295575 explains that, in such a heat radiating structure, since deformations due to thermal expansion and thermal contraction of each member can be absorbed by backlashes of the screws, forces due to the thermal deformations can be prevented from being applied from the cooling device to the solid-state image sensors.

Also, JP 2002-247594 proposes a heat radiating structure in which a thermoelectric cooling device fixed to a heat conducting plate is so placed as to be in close contact with the back faces of the solid-state image sensors with proper force by utilizing the elasticity of the heat conducting plate. JP 2002-247594 explains that, in such a heat radiating structure, since the cooling device can be put into close contact with the back faces of the solid-state image sensors by utilizing the elasticity of the heat conducting plate, there can be realized an efficient heat radiation.

JP 2001-308569 proposes a heat radiating structure or heatsink structure using no thermoelectric cooling device in which a metallic component is inserted between the back face of a solid-state image sensor and the image sensor board so that heat is allowed to escape from the solid-state image sensor through the metallic component.

SUMMARY OF THE INVENTION

In recent years, the positioning of individual solid-state image sensors in such a 3CCD camera has created a demand for accuracy on the order of μm. For example, the positioning of the individual solid-state image sensors 2r, 2g, 2b, as it stands, has been coming to require accuracies on the order of several tens of μm for the positioning in the optical axis direction because of a depth of focus, and the order of μm for that of the in-plane direction of the subject image.

However, in the heat radiating structure of JP H1-295575, since external forces are absorbed by the backlashes of the screws, external forces caused by small thermal deformations cannot be absorbed enough. Therefore, depending on the magnitude of an external force that acts on the solid-state image sensors, the external force may affect the positioning accuracy of those image sensors, giving rise to an issue of deterioration of registration accuracy due to positional shifts. Also, in the heat radiating structure of JP 2002-247594, since external forces are applied to the solid-state image sensors by elasticity of the heat conducting plate and the external forces vary depending on thermal expansion or the like, there are cases where the positioning accuracy is affected by the external forces. Furthermore; in the heat radiating structures of JP H1-295575 and JP 2002-247594, since relatively expensive thermoelectric cooling devices are used, a further issue is that the image pickup device increases in cost.

Even in the heat radiating structure or heatsink structure of JP 2001-308569 using no cooling device, since the metallic component is placed so as to be in contact with the back faces of the solid-state image sensors, loads due to springbacks caused by thermal expansion and contraction of the metallic member are applied to the solid-state image sensors. This results in the occurrence of positional shifts at the bonding surfaces between the solid-state image sensors and the prism members, giving rise to an issue of deterioration of registration accuracy due to the positional shifts. Furthermore, any one of the known heat radiating structures or heatsink structures is complicated in structure, and thus are not simple to attach or handle.

Moreover, there has been widely used a technique of fixing bonding surfaces of the solid-state image sensors $2r$, $2g$, $2b$, in which, with the use of UV adhesive (ultraviolet curable adhesive) for the bonding between front faces of the solid-state image sensors $2r$, $2g$, $2b$ and the prisms $1r$, $1g$, $1b$, positioning (for six axes) for the solid-state, image sensors $2r$, $2g$, $2b$ are performed after the adhesive is applied to between their bonding surfaces, and ultraviolet radiation is applied thereto to cure the adhesive and thereby fix the bonding surfaces.

However, since such UV adhesive has a high temperature creep property (a property of creeping due to continued application of loads under a high temperature environment), loads due to the springbacks of the metallic component and the like become a serious matter particularly as the ambient temperature of the solid-state image sensors $2r$, $2g$, $2b$ (i.e., internal temperature within the device casing) becomes higher.

Accordingly, an object of the present invention, lying in solving the above-described issues, is to provide a heatsink structure of solid-state image sensors to be used for a solid-state image pickup device having those solid-state image sensors. The heatsink structure of the solid-state image sensors functioning to cool the solid-state image sensors while reducing any external-force loads applied to the solid-state image sensors with a relatively simple structure.

In order to achieve the above object, the present invention has the following constitutions.

According to a first aspect of the present invention, there is provided a heatsink structure for solid-state image sensors, comprising a foil-like heatsink sheet made of a high heat conductivity material, the heatsink sheet having a first fixed portion fixed to a solid-state image sensor and a second fixed portion fixed to another member, and having a plurality of cutout portions formed along directions directed from the first fixed portion toward the second fixed portion.

According to a second aspect of the present invention, there is provided the heatsink structure for solid-state image sensors as defined in the first aspect, wherein in the heatsink sheet, the respective cutout portions are formed at positions closer to the first fixed portion than to the second fixed portion.

According to a third aspect of the present invention, there is provided the heatsink structure for solid-state image sensors as defined in the first aspect, wherein a plurality of the heatsink sheets are provided for a plurality of the solid-state image sensors, respectively and independently.

According to a fourth aspect of the present invention, there is provided the heatsink, structure for solid-state image sensors as defined in the first aspect, wherein the heatsink sheet has a plurality of the first fixed portions fixed to a plurality of the solid-state image sensors, respectively and independently.

According to a fifth aspect of the present invention, there is provided the heatsink structure for solid-state image sensors as defined in the first aspect, wherein a direction from the first fixed portion toward the second fixed portion of the heatsink sheet is a heat flow direction from the solid-state image sensor toward the another member, and the respective cutout portions are formed so that the heatsink sheet is at least partly divided in directions perpendicular to the heat flow direction.

According to a sixth aspect of the present invention, there is provided the heatsink structure for solid-state image sensors as defined in the first aspect, wherein the cutout portions are slits each having a width.

According to a seventh aspect of the present invention, there is provided the heatsink structure for solid-state image sensors as defined in the first aspect, wherein in the heatsink sheet, the respective cutout portions are formed so as to range from the first fixed portion to the second fixed portion.

According to an eighth aspect of the present invention, there is provided the heatsink structure for solid-state image sensors as defined in the first aspect, wherein the first fixed portion of the heatsink sheet is placed between the solid-state image sensor and an image sensor board on which the solid-state image sensor is mounted.

According to a ninth aspect of the present invention, there is provided a heatsink structure for solid-state image sensors, comprising a plurality of linear or strip-shaped heatsink members each of which has a first fixed portion fixed to a solid-state image sensor and a second fixed portion fixed to another member, the linear or strip-shaped heatsink members being made of a high heat conductivity material.

According to a tenth aspect of the present invention, there is provided a heatsink structure for solid-state image sensors, comprising:

a foil-like heatsink sheet which has a plurality of first fixed portions fixed to a plurality of solid-state image sensors fixed to a color separation prism for separating light into a plurality of color components, and a second fixed portion fixed to another member, the foil-like heatsink sheet being made of a high heat conductivity material, wherein a plurality of cutout portions extending along directions from the first fixed portions toward the second fixed portion are formed in vicinities of the first fixed portions of the heatsink sheet fixed to one of the solid-state image sensors that serves as a reference image sensor among the plurality of solid-state image sensors.

According to an eleventh aspect of the present invention, there is provided the heatsink structure for solid-state image sensors as defined in the tenth aspect, wherein in the heatsink sheet, the respective cutout portions are formed in vicinities of all the first fixed portions fixed to the respective solid-state image sensors.

According to the present invention, in a foil-like heatsink sheet which is made of a high heat conductivity material and which has a first fixed portion fixed to a solid-state image sensor and a second fixed portion fixed to another member, a plurality of cutout portions are formed along directions from the first fixed portion toward the second fixed portion, by which stress loads occurring due to thermal expansion and the like in directions perpendicular to the directions in which the cutout portions are formed can be reduced. Also, when the respective cutout portions are formed along heat flow directions, heat conductivity of the heatsink sheet is never impaired. Accordingly, there can be provided a heatsink structure for solid-state image sensors which is capable of reducing loads (stress loads) applied to the solid-state image sensors through the heatsink sheet and moreover suppressing any deterioration of the registration accuracy without impairing the heatsink characteristics with a relatively simple structure.

BRIEF DESCRIPTION OF THE DRAWINGS

These and other aspects and features of the present invention will become clear from the following description taken in conjunction with the preferred embodiments thereof with reference to the accompanying drawing's, in which.

DETAILED DESCRIPTION OF THE PREFERRED EMBODIMENTS

Figure 1:
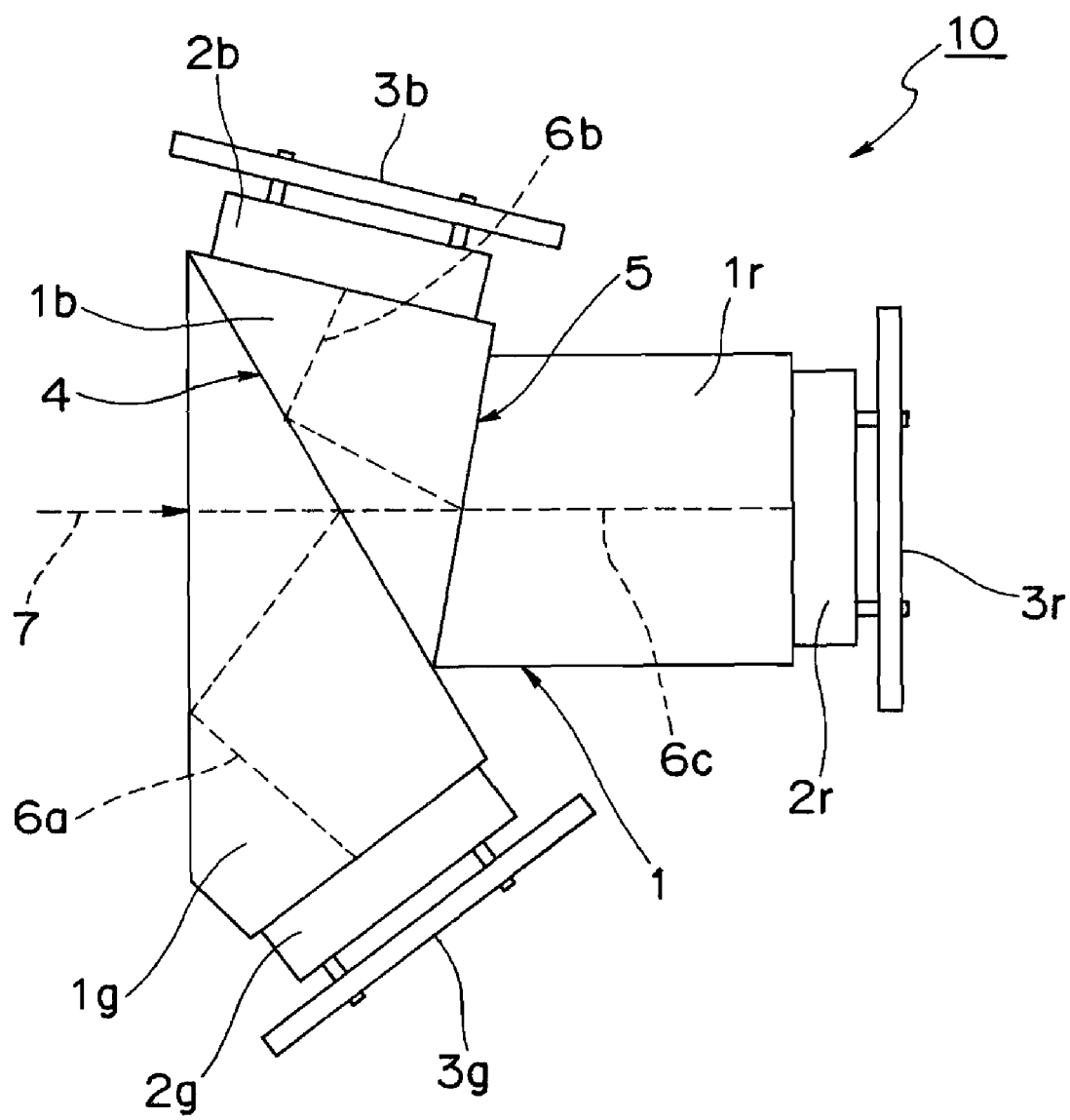
FIG. 1 is a schematic view of an image pickup block in a conventional 3CCD color camera.

Before the description of the present invention proceeds, it is to be noted that like parts are designated by like reference numerals throughout the accompanying drawings.

Hereinbelow, embodiments of the present invention will be described in detail with reference to the accompanying drawings.

First Embodiment

Figure 2:
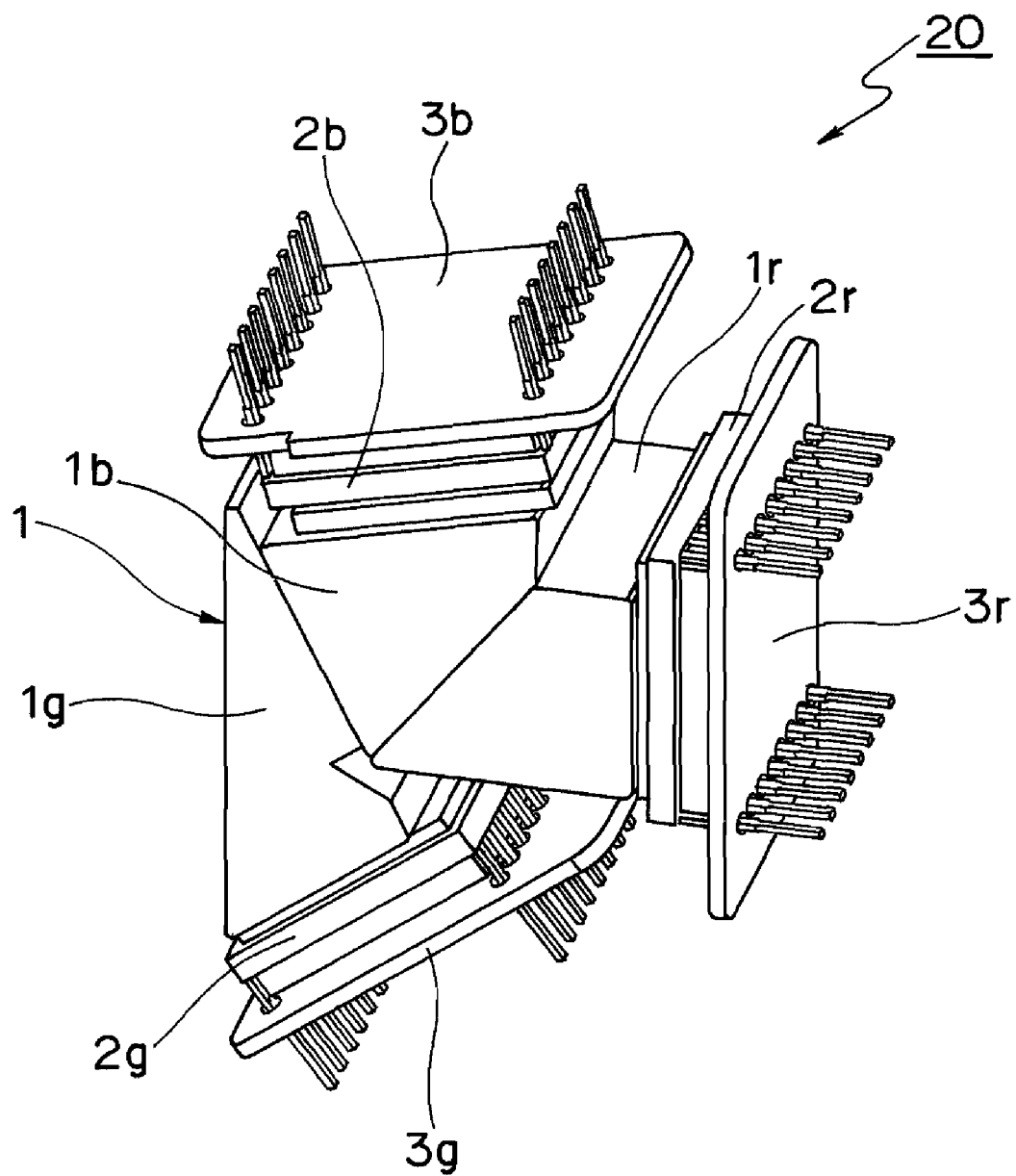
FIG. 2 is a schematic perspective view of an image pickup block which has not yet been equipped with a heatsink structure for solid-state image sensors according to a first embodiment of the invention.
Figure 3:
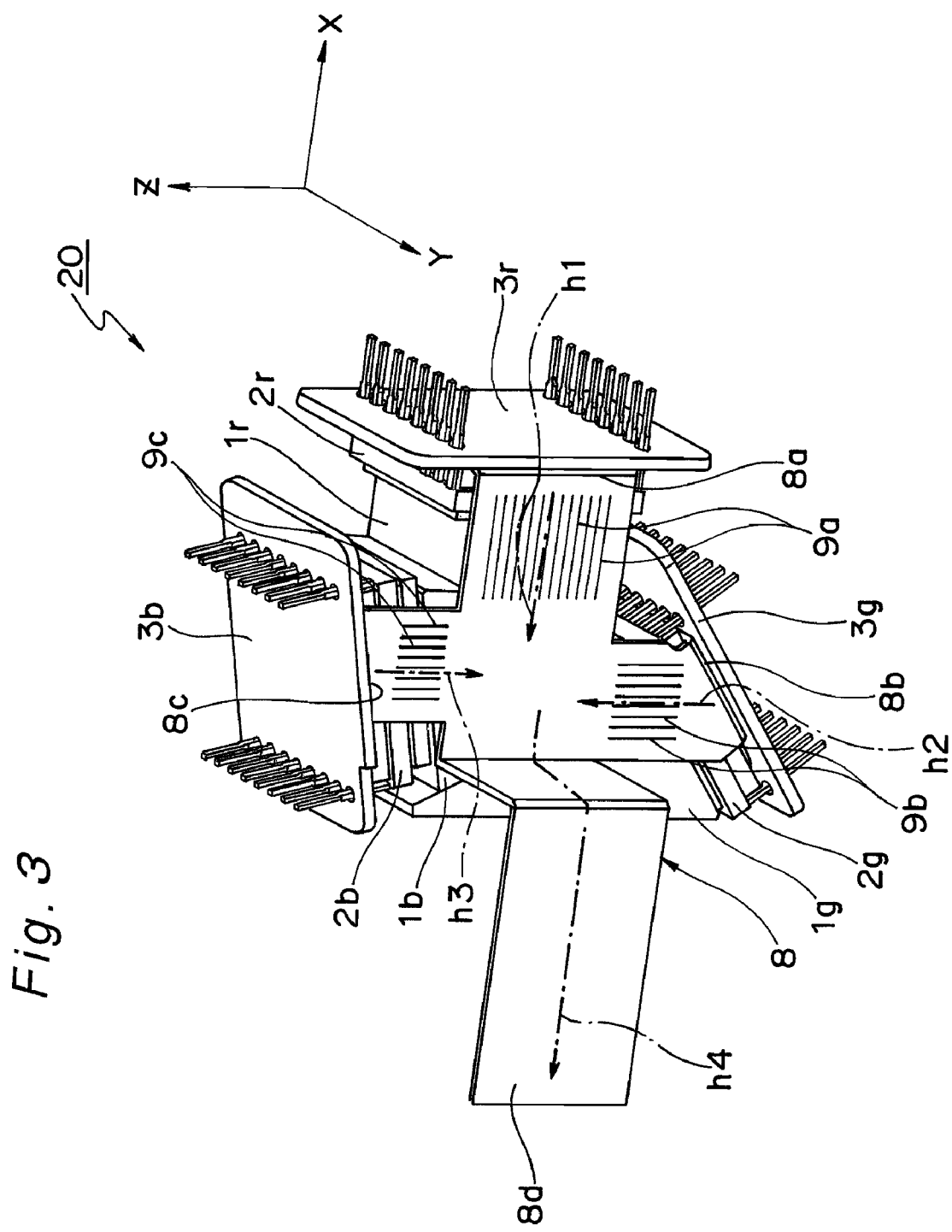
FIG. 3 is a schematic perspective view of the image pickup block of FIG. 2 that is equipped with the heatsink structure of the first embodiment.

FIG. 2 shows a schematic perspective view of an image pickup block 20 in a 3CCD camera which adopts a heatsink structure for solid-state image sensors according to a first embodiment of the invention (where the image pickup block 20 is not equipped with a heatsink structure). FIG. 3 shows a schematic perspective view of the image pickup block 20 equipped with the heatsink structure of the first embodiment. It is noted that the image pickup block 20 is similar in structure to the image pickup block 10 of FIG. 1, and so like component members are designated by like reference numerals and their description is omitted.

As shown in FIGS. 2 and 3, the heatsink structure for solid-state image sensors of the first embodiment is so made up that first end portions 8a, 8b, 8c (first fixed portions) of a foil-shaped heatsink sheet 8 formed of a high heat conductivity material are fixed to back faces of the solid-state image sensors 2r, 2g, 2b, respectively, while a second end portion of the heatsink sheet 8 (second fixed portion) is fixed to a lens barrel casing (not shown) formed of ABS resin or the like by screwing or the like. Heat generated in the solid-state image sensors 2r, 2g, 2b is transferred through the heatsink sheet 8 to the lens barrel casing, so that temperatures of the individual solid-state image sensors 2r, 2g, 2b are decreased.

For the heatsink sheet 8, for example, copper or graphite sheet or the like is used as a high heat conductivity material, and formed into a foil shape having a thickness of, for example, 0.1 mm or less so that the heatsink sheet 8 has a high degree of flexibility in its thicknesswise direction.

Figure 6:
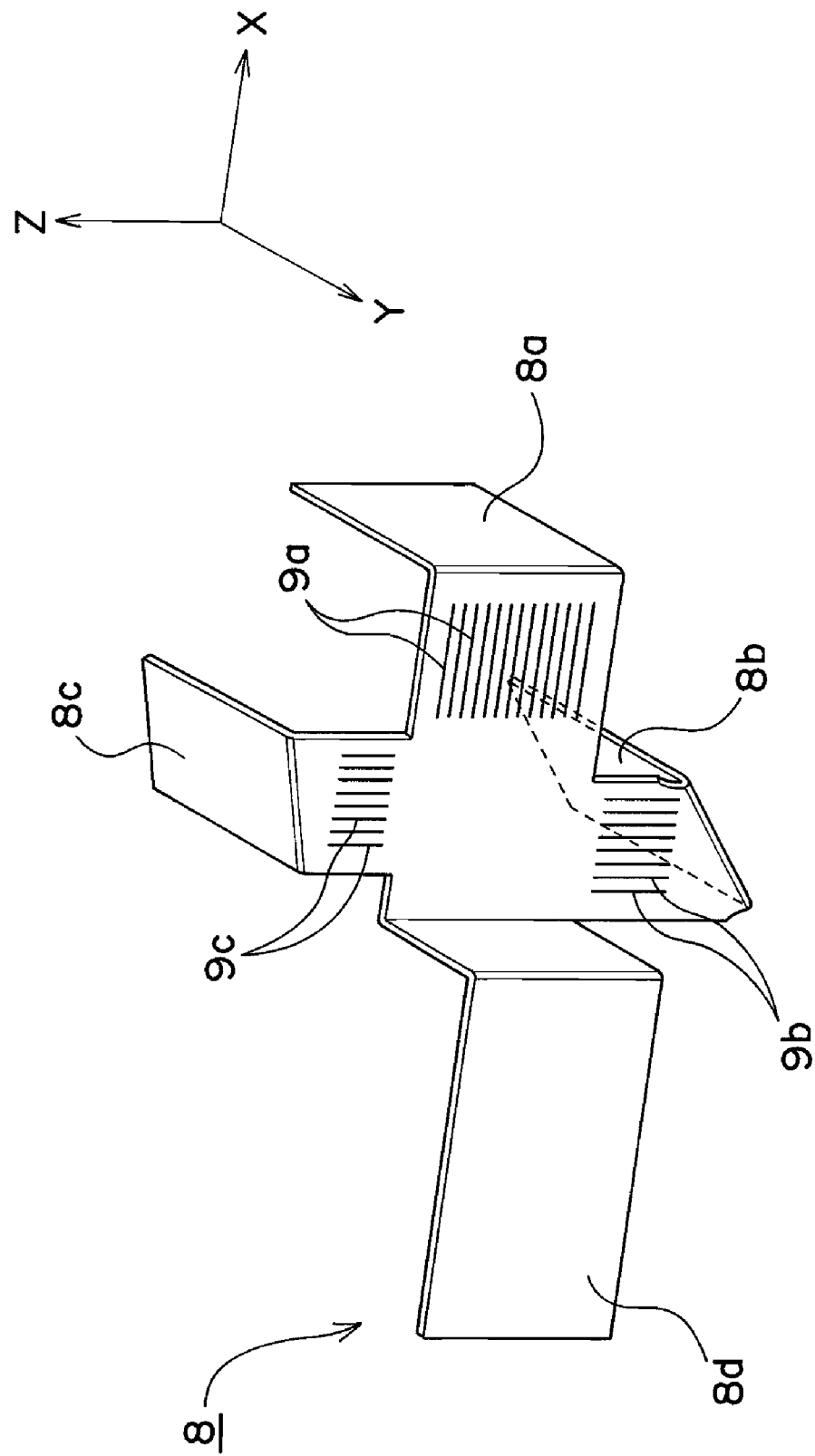
FIG. 6 is a schematic perspective view of a heatsink sheet of the first embodiment.

FIG. 6 shows a schematic perspective view of the heatsink sheet 8. As shown in FIGS. 3 and 6, the first end portions 8a, 8b, 8c of the heatsink sheet 8 are each bent by approximately 90° thicknesswise so as to be inserted and fixed between the solid-state image sensors 2r, 2g, 2b and the image sensor boards 3r, 3g, 3b, respectively. In such a fixed state of the first end portions 8a, 8b, 8c as shown in FIG. 3, the heatsink sheet 8 inserted between the solid-state image sensors 2r, 2g, 2b and the image sensor boards 3r, 3g, 3b is lightly sandwiched by the solid-state image sensors and the image sensor boards. In this state, the first end portions 8a, 8b, 8c of the heatsink sheet 8 are in contact with the back faces of the solid-state image sensors 2r, 2g, 2b. In addition, for more contactability between the heatsink sheet 8 and the solid-state image sensors 2r, 2g, 2b, grease or the like may also be used. It is noted here that the term "fixed" for the first end portions 8a, 8b, 8c of the heatsink sheet 8 and the solid-state image sensors 2r, 2g, 2b refers to a state in which a force, when applied to one member, is transferred to the other. In particular, in this embodiment, the term refers to a state in which the heatsink sheet 8 is lightly sandwiched so that a force, when applied in directions extending along surfaces of the first end portions 8a, 8b, 8c of the heatsink sheet 8 is transferable by frictional forces acting in the directions extending along the back faces of the solid-state image sensors 2r, 2g, 2b.

Referring now to FIG. 3, a leftward-rightward direction as viewed in the drawing sheet is assumed as an X direction, a direction directed toward the viewer in the drawing sheet and crossing perpendicular to the X direction is assumed as a Y direction, and a direction directed upward and downward in the drawing sheet and crossing perpendicular to the X and Y directions is assumed as a Z direction. In the heatsink sheet 8 which is placed at a roughly central portion of one side face of the image pickup block 20, the first end portions 8a, 8b, 8c are branched from the roughly central portion of the side face of the image pickup block 20 in three directions (rightward X direction, upward Z direction and downward Z direction) so as to extend individually. The first end portions 8a, 8b, 8c are inserted between the corresponding ones of the solid-state image sensors and the image sensor boards, respectively, in a state of being folded each by roughly 90° depthwise in the Y direction. On the other hand, the second end portion 8d extends from the side-face central portion of the image pickup block 20 along a leftward X direction different from the above three directions, and is bent a plurality of times so as to avoid other members (not shown), thus being fixed to a lens barrel casing (not shown).

Further, as shown in FIG. 3, a plurality of cutout portions 9a, 9b, 9c are formed in the vicinities of the first end portions 8a, 8b, 8c, respectively, in the heatsink sheet 8. The cutout portions 9a, 9b, 9c are provided so as to extend through front and rear surfaces of the heatsink sheet 8. The individual cutout portions 9a, 9b, 9c, in their branched portions in the heatsink sheet 8 toward the first end portions 8a, 8b, 8c, respectively, are so formed as to be parallel to heat flow directions (heat flux directions) h1, h2, h3, which are directions from the first end portions 8a, 8b, 8c, respectively, toward the second end portion 8d. That is, a plurality of cutout portions 9a, 9b, 9c are formed along directions perpendicular to the widthwise direction of the heatsink sheet 8.

It is when loads (stress loads) are applied along shearing directions of bonding surfaces between the solid-state image sensors 2r, 2g, 2b and the prism members 1r, 1g, 1b that deteriorations of the registration accuracy, which is an issue addressed by the present invention, matters. Such loads in the directions in which the bonding surfaces are sheared, are applied along the longitudinal direction and widthwise direction of the heatsink sheet 8 due to its thermal expansion or thermal contraction. However, since the heatsink sheet 8 has bent portions formed in its longitudinal direction, loads in the longitudinal direction are more easily absorbed while loads in the widthwise direction, conversely being less easily absorbed, matter. The widthwise loads in the shearing direction are proportional to the cube of the width of the heatsink sheet 8, so that providing the plurality of cutout portions 9a, 9b, 9c along directions perpendicular to the widthwise direction allows the loads in the shearing direction to be reduced. For instance, when the heatsink sheet 8 is provided with nine cutout portions so as to be divided widthwise into ten portions, the shearing stress can be reduced to about one hundredth (that is, $1/100$) or so, as compared with cases in which no cutout portions are provided.

Meanwhile, such cutout portions 9a, 9b, 9c as shown above are formed parallel to directions perpendicular to the widthwise direction of the heatsink sheet 8, i.e., to the heat flow directions h1, h2, h3. On this account, heat transferred from the solid-state image sensors 2r, 2g, 2b through the heatsink sheet 8 flows along directions parallel to the cutout portions 9a, 9b, 9c, so that the heat flow is almost never obstructed. Accordingly, the resulting heat transfer quantity of the heatsink sheet 8 is substantially equivalent to that of cases in which no cutout portions are formed, hence there is almost no deterioration of the heatsink characteristic of the heatsink sheet 8 due to the formation of the cutout portions.

Thus, according to the heatsink structure for solid-state image sensors in this first embodiment, loads in the shearing direction, which would be a major cause of deterioration of the registration accuracy, especially shearing stress loads occurring in the widthwise direction of the heatsink sheet 8, can be reduced by the formation of a plurality of cutout portions almost without causing any deterioration of the heatsink characteristic, as compared with conventional heatsink structures. Also, such a heatsink structure can be realized by forming a plurality of cutout portions 9a, 9b, 9c in the foil-formed heatsink sheet 8, thereby making the structure simple, making any complicated adjustment components and adjustment processes unnecessary, and making the structure easier to handle.

Figure 4:
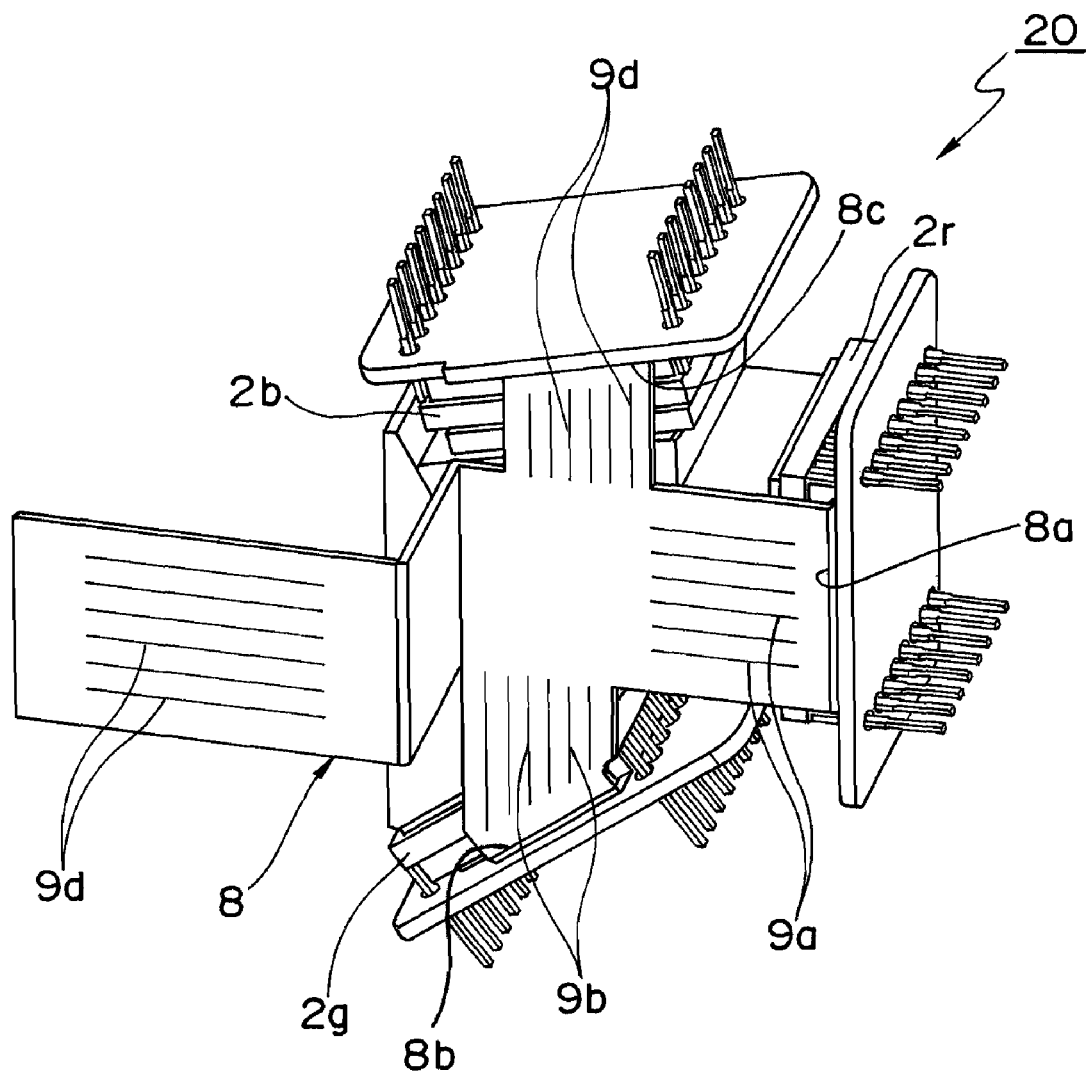
FIG. 4 is a schematic perspective view of a heatsink structure according to a modification of the first embodiment.

The above description has been directed to a case where the cutout portions 9a, 9b, 9c are formed in the vicinities of the solid-state image sensors 2r, 2g, 2b, i.e., in vicinities of the first end portions 8a, 8b, 8c, respectively. However, those cutout portions may be formed at other various positions without being limited to such the case described above. For example, cutout portions 9d may be formed in the vicinities of the second end portion 8d of the heatsink sheet 8. Such a cutout portion 9d may be formed singly along a heat flow direction h4, or otherwise, as shown in FIG. 4, cutout portions 9d may be provided in combination with the cutout portions 9a, 9b, 9c, respectively. In addition, adopting a structure in which the cutout portions 9a, 9b, 9c are provided in vicinities of positions targeted for reduction of loads in the shearing direction, i.e. in vicinities of the first end portions 8a, 8b, 8c, respectively, makes it possible to more effectively reduce stress loads applied to the solid-state image sensors 2r, 2g, 2b.

The above description has been directed to an example of the structure in which the cutout portions 9a, 9b, 9c are formed in the heatsink sheet 8. However, such cutout portions 9a, 9b, 9c may be a plurality of slits each having a width of, for example, about 0.1 mm, in which case similar effects can also be obtained. That is, the cutout portions of the first embodiment, which are provided to divide the heatsink sheet 8 into a plurality of divisions along its widthwise direction, may be either cutout portions each not having a width or cutout portions (slits) each having a width only if, such division can be achieved. Further, these cutout portions do not necessarily need to be formed at equal intervals, and the number of cutout portions is preferably determined in consideration of the loads to be reduced or the strength of the heatsink sheet 8 or the like.

The above description has also been directed to a case where the cutout portions 9a, 9b, 9c are provided in vicinities of all the first end portions 8a, 8b, 8c fixed to the three solid-state image sensors 2r, 2g, 2b, respectively. Instead, the cutout portions may be formed only in a vicinity of the first end portion fixed to a particular solid-state image sensor. For example, in a structure in which a solid-state image sensor serves as a reference image sensor among three solid-state image sensors (i.e., a reference for adjustment of optical characteristics), cutout portions may be provided only in a vicinity of the first end portion fixed to the reference image sensor, and not in the heatsink sheet fixed to the other image sensors.

Second Embodiment

Figure 5:
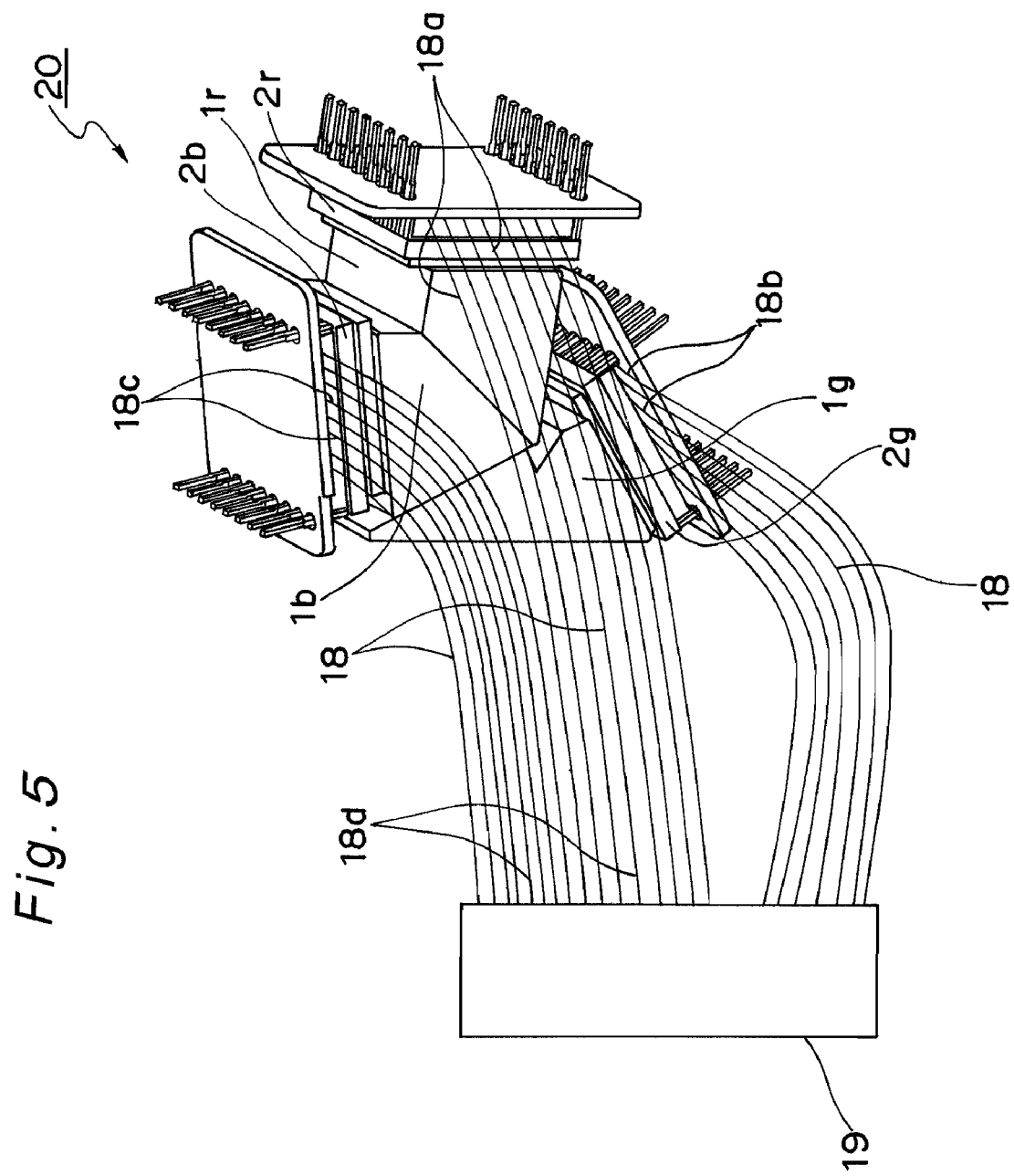
FIG. 5 is a schematic perspective view of an image pickup block equipped with a heatsink structure for solid-state image sensors according to a second embodiment of the invention.

The present invention is not limited to the above-described first embodiment, and may be carried out in other various modes. As an example, FIG. 5 shows a schematic perspective view of an image pickup block 20 equipped with a heatsink structure for solid-state image sensors according to a second embodiment of the invention. It is noted that the image pickup block 20 in FIG. 5 is similar in structure to the image pickup block 20 of FIG. 2, and so like reference numerals are used and their description is omitted.

As shown in FIG. 5, the heatsink structure of this second embodiment differs from that of the first embodiment in that a plurality of linear heatsink lines (or linear heatsink members) 18 made of a high heat conductivity material are employed instead of the heatsink sheet 8 employed in the first embodiment.

Such heatsink lines 18 may be formed from copper wire, or graphite sheet having a specified width. First end portions 18a, 18b, 18c that are one-end portions of the plurality of heatsink lines 18 are fixed to a plurality of first heatsink bases (not shown) which are fixed to the back faces of the solid-state image sensors 2r, 2g, 2b, respectively. Also, second end portions 18d, which are the other-end portions, are fixed to a second heatsink base 19, and the second heatsink base 19 is fixed to a lens barrel casing (not shown). The first heatsink bases and the second heatsink base 19 are formed from a high heat conductivity material into, for example, sheet-like shapes. Thus, the linear heatsink lines 18 are not directly fixed to the solid-state image sensors 2r, 2g, 2b, and the first heatsink bases are provided interveniently so that the heatsink lines 18 can be bettered in their fittability and handlability.

According to the heatsink structure of the second embodiment shown above, the heatsink lines 18 are improved in the degree of freedom of placement, compared with the heatsink structure of the first embodiment, thus providing flexibly for complicated component layouts inside the device interior that is becoming increasingly higher in density along with the trend toward lighter, thinner, shorter and smaller sizes of devices.

Although the above description is directed to a case where the linear heatsink lines 18 are employed, the heatsink lines may also be formed each into a strip shape having an infinitesimal width. That is, when respective cutout portions are formed in the heatsink sheet 8 of the first embodiment so as to range from vicinities of the first end portions 8a, 8b, 8c to a vicinity of the second end portion 8d, it becomes possible to make up such linear or strip-shaped heatsink lines as described above. In addition, twisting foil-like graphite sheet having a specified width also makes it possible to improve the strength of the heatsink lines.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

The entire disclosure of Japanese Patent Application No. 2007-039131 filed on Feb. 20, 2007, including specification, claims, and drawings is incorporated herein by reference in its entirety.

What is claimed is:

1. A heatsink structure for solid-state image sensors, the heatsink structure being usable with an image pickup device including a prism for separating incident light that has come up through an image pickup lens into specified color components, a plurality of solid-state image sensors fixed to light-outgoing surfaces of the prism, and image sensor boards on which the solid-state image sensors are mounted, respectively, the heatsink structure comprising a heatsink sheet placed on a side face of one of the solid-state image sensors, the heatsink sheet being made of a flexible foil-like heat conductivity material, the heatsink sheet having a first end portion fixed to a back face of at least one of the solid-state image sensors and a second end portion fixed to another member, the heatsink sheet having cutout portions which divide the heatsink sheet widthwise into a plurality of portions along directions from the first end portion and toward the second end portion.

2. The heatsink structure for solid-state image sensors as defined in claim 1, wherein in the heatsink sheet, the respective cutout portions are formed at positions closer to the first end portion than to the second end portion.

3. The heatsink structure for solid-state image sensors as defined in claim 1, wherein a plurality of the heatsink sheets are provided for the plurality of the solid-state image sensors, respectively and independently.

4. The heatsink structure for solid-state image sensors as defined in claim 1, wherein the heatsink sheet has a plurality of the first end portions fixed to the plurality of the solid-state image sensors, respectively and independently.

5. The heatsink structure for solid-state image sensors as defined in claim 1, wherein the cutout portions are slits each having a width.

6. The heatsink structure for solid-state image sensors as defined in claim 1, wherein in the heatsink sheet, the respective cutout portions are formed so as to range from the first end portion to the second end portion.

7. The heatsink structure for solid-state image sensors as defined in claim 1, wherein the first end portion of the heatsink sheet is placed between the solid-state image sensor and the image sensor board on which the solid-state image sensor is mounted.

* * * * *